United States Patent [19]

Ishihara et al.

[11] 4,200,924
[45] Apr. 29, 1980

[54] LOGICAL OPERATION CIRCUIT USING MAGNETIC BUBBLES

[75] Inventors: Hideo Ishihara, Kamakura; Norio Seki, Tokyo, both of Japan

[73] Assignee: Kokusai Denshin Denwa Kabushiki Kaisha, Japan

[21] Appl. No.: 3,970

[22] Filed: Jan. 16, 1979

Related U.S. Application Data

[63] Continuation of Ser. No. 736,776, Oct. 29, 1977, abandoned.

[30] Foreign Application Priority Data

Oct. 30, 1975 [JP] Japan .................................. 50/130838

[51] Int. Cl.$^2$ ............................................. G11C 19/08
[52] U.S. Cl. .......................................... 365/5; 365/13; 365/43
[58] Field of Search ........................... 365/5, 13, 16, 43

[56] References Cited

U.S. PATENT DOCUMENTS

| | | | |
|---|---|---|---|
| 3,723,716 | 3/1973 | Bobeck et al. | 365/5 |
| 3,820,091 | 6/1974 | Kohara | 365/5 |

*Primary Examiner*—James W. Moffitt
*Attorney, Agent, or Firm*—Robert E. Burns; Emmanuel J. Lobato; Bruce L. Adams

[57] ABSTRACT

A logical operation circuit for performing a desired logical operation by transferring at least one magnetic bubble on a plurality of magnetic bubble transfer routes paths employing chevron patterns, in which two neighboring ones of the magnetic bubble transfer routes provides with a first magnetic bubble transfer section which is formed by narrowed transfer routes or by magnetic bubble elongating means, so that a magnetic bubble transferred through one of the two magnetic bubble transfer routes is stably held across the two magnetic bubble transfer routes of the first magnetic bubble transfer section, while two magnetic bubbles transferred through the two magnetic bubble transfer routes on the two magnetic bubble transfer routes respectively. A second magnetic bubble transfer section formed by enlarging the space between the two neighboring magnetic bubble transfer routes along the transmission direction of said magnetic bubble is provided in which the magnetic bubble having passed through the first magnetic bubble transfer section is elongated in such a state as resting across both of the two magnetic bubble transfer routes, while the two magnetic bubbles are held on the enlarged two neighboring magnetic bubble transfer routes respectively. The magnetic bubble or bubbles be derived from at least one of the two magnetic bubble transfer routes or from another magnetic bubble transfer route coupled with the elongated magnetic bubble as a logical output corresponding to a desired logical operation with respect to the state of input of the magnetic bubble to the two magnetic bubble transfer routes.

4 Claims, 13 Drawing Figures

4,200,924

LOGICAL OPERATION CIRCUIT USING MAGNETIC BUBBLES

This is a continuation of application Ser. No. 736,776, filed Oct. 29, 1977, now abandoned.

FIELD OF THE INVENTION

The present invention relates to a circuit for performing a binary logical operation by transferring circular magnetic domains produced in a magnetic substance.

BACKGROUND OF THE INVENTION

In the thin films of rare earth orthoferrite, magnetic garnet or amorphous magnetic substances, there can be produced small cylindrical magnetic domains, that is, so-called magnetic bubbles, (hereunder merely called magnetic bubbles) which are known as usable for performing logical operations as well as the memory function as information carriers, because they are transferred in the film surface with small energy and have mutual repulsive actions against each other.

As for the logical operation gate by the use of the magnetic bubble, there have heretofore been made various proposals, but their common defects are such that since the repulsive force between magnetic bubbles and the repulsive or attractive force between a pattern and the magnetic bubble are hard to be balanced, their circuit design is difficult, so that their operation margins are very small.

BRIEF SUMMARY OF THE INVENTION

An object of the present invention is to provide a magnetic bubble logical operation circuit with a large operational margin and which is easy to design.

To attain the above object of this invention, a logical operation circuit for performing a desired logical operation by transferring at least one magnetic bubble on a plurality of magnetic bubble transfer routes paths employing chevron patterns is provided, in which two neighboring ones of the magnetic bubble transfer routes provides a first magnetic bubble transfer section which is formed by narrowed transfer routes or by magnetic bubble elongating means, so that a magnetic bubble transferred through one of the two magnetic bubble transfer routes is stably held across the two magnetic bubble transfer routes of the first magnetic bubble transfer section, while two magnetic bubbles transferred through the two magnetic bubble transfer routes on the two magnetic bubble transfer routes respectively. A second magnetic bubble transfer section formed by enlarging the space between the two neighboring magnetic bubble transfer routes along the transmission direction of said magnetic bubble is provided in which the magnetic bubble having passed through the first magnetic bubble transfer section is elongated in such a state as to rest across both of the two magnetic bubble transfer routes, while the two magnetic bubbles are held on the enlarged two neighboring magnetic bubble transfer routes respectively. The magnetic bubble or bubbles are derived from at least one of the two magnetic bubble transfer routes or from another magnetic bubble transfer route coupled with the elongated magnetic bubble as a logical output corresponding to a desired logical operation with respect to the state of input of the magnetic bubble to the two magnetic bubble transfer routes.

BRIEF DESCRIPTION OF ACCOMPANYING DRAWINGS

The principle, construction and operation of the present invention will be clearly understood from the following detailed description taken in conjunction with the accompanying drawings, in which.

DETAILED DESCRIPTION OF THE INVENTION

To make clear the difference between the present invention and conventional circuits, conventional circuits will first be described.

Figure 1A:
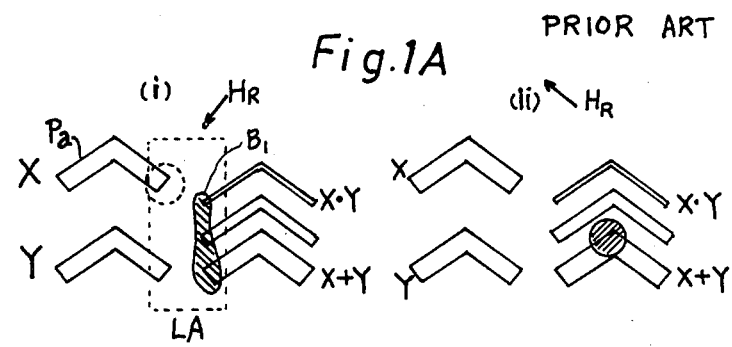
FIGS. 1A and 1B show magnetic bubble transfer route patterns as an example of a conventional AND-OR gate circuit.
Figure 1B:
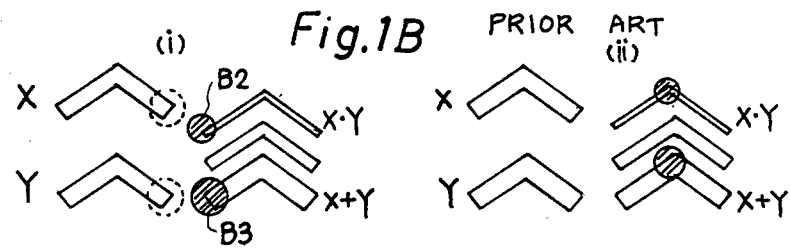

In FIGS. 1A and 1B showing a diagram of a conventional AND-OR gate circuit using known chevron pattern magnetic bubble transfer circuits, the patterns Pa are called chevron patterns, and are formed of films of ferromagnetic substance which are contact-deposited on the material forming magnetic bubbles (paper surface in the drawing). In such a state, if a rotating magnetic field $H_R$ is applied to the film surface, it produces a magnetic pole which is successively shifted in the film surface, so that the magnetic bubbles are moved by being, pulled by the magnetic pole. As for the operation of this AND-OR gate, in a case where there is at first an input magnetic bubble only at an input Y, the input magnetic bubble is directly applied to an OR output terminal X+Y, and in a case where there is an input magnetic bubble only at an input X, a magnetic domain B1, as shown in FIG. 1A—(i), moves, by the aide of the magnetic field inclination produced by different pattern widths in the logical operation area LA, to the lowermost chevron pattern of the largest width as shown in FIG. 1A—(ii), and then to the OR output terminal X+Y. Moreover, when the inputs X and Y have simultaneous magnetic bubble inputs, a mutual repulsive force acts on two magnetic bubbles B2 and B3, and neither of them disappears nor do they merge together, but they are shifted on the chevron patterns of the width and the largest width as shown in FIG. 1B—(ii), then going out to the AND output terminal X·Y, and the OR output terminal X+Y.

However, since this AND-OR gate has a magnetic field inclination in the logical operation area LA, when the inputs are X=1 and Y=1 as shown in FIG. 1B, the magnetic bubble B2 receives a repulsive force from the bubble B3 so as to make the diameter of B2 small under a week attractive force from the patterns. Accordingly, such gate at times does not operate correctly and the magnetic bubble is repelled outwardly or caused to disappear.

Figures 2A, 2B:
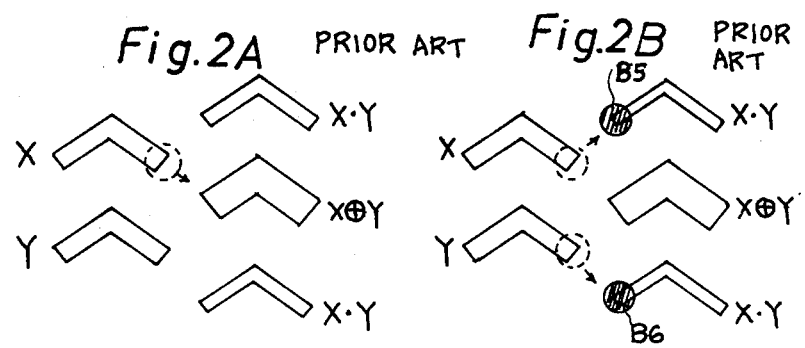
FIGS. 2A, 2B and 2C show magnetic bubble transfer route patterns as an example of a conventional AND-Exclusive OR gate circuit.
Figure 2C:
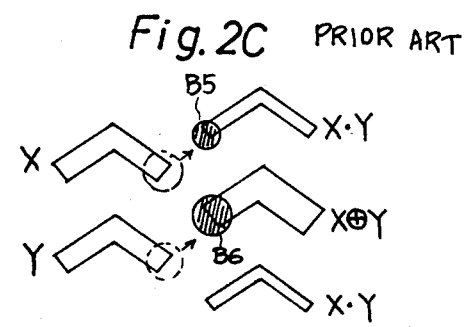

FIGS. 2A, 2B and 2C are explanatory of the operation of a conventional AND-Exclusive OR gate which employs chevron patterns. In this circuit, when there is an input magnetic bubble only at the input X or Y, the input magnetic bubble essentially passes through the middle broad patterns, as shown in FIG. 2A to an Exclusive OR output terminal. When magnetic bubbles have entered both inputs X and Y, the mutual repulsive force between the two input magnetic bubbles acts to each other as shown in FIG. 2B, and the two magnetic bubbles shift through upper and lower patterns of the narrow width to the AND output terminals X·Y, X·Y, respectively. In this circuit, however, when the inputs are X=1 and Y=1, delicate balancing is necessary in the repulsive force between the magnetic bubbles and also in the attractive force between the magnetic bubble and the patterns in order that an operation as shown in FIG. 2B should be accurately carried out. In that case, if the balancing is slightly lost, such a mis-operation is apt to occur as the magnetic bubble B6 is transferred to the middle pattern as shown in FIG. 2C. That is because there are three stable positions for the magnetic bubble after the repulsion operation, despite there being only two input magnetic bubbles. This is the major cause for the impossibility of making the operational margin great.

Figure 3A:
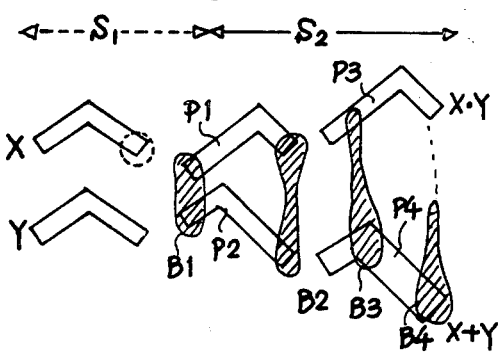
FIGS. 3A and 3B show magnetic bubble transfer route patterns illustrating an embodiment of an AND-OR gate circuit of this invention.
Figure 3B:
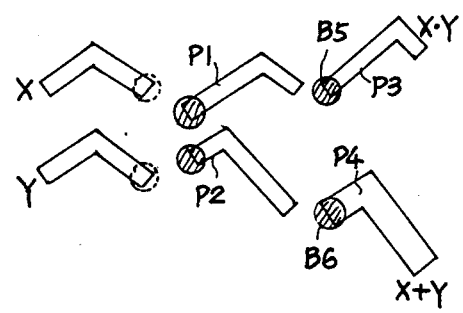

With reference to FIGS., 3A and 3B an example of an AND-OR circuit in accordance with the present invention will now be described. In this circuit, as illustrated, the widths of transfer patterns P1 and P2 in the operation area are made equal to each other so that when magnetic bubbles are applied thereto, there is provided a stable position or a number of positions for the magnetic bubble or bubbles in the operation area equal in number to that of the input magnetic bubble or bubbles. As shown in FIG. 3A, in a case where only one magnetic bubble has entered two neighboring magnetic bubble transfer routes, the magnetic bubble is held across the patterns P1 and P2, taking the patterns P1 and P2 as one stable point, as indicated by B1. In a case where two magnetic bubbles have entered the two magnetic bubble transfer routes paths as shown in FIG. 3B, the pattern P1 and P2 act respectively as separate stable points due to the mutual repulsive force of the magnetic bubbles. This portion forms a first magnetic bubble transfer section. In the case of an input being 1-0 or 0-1 as shown in FIG. 3A, the magnetic bubble shifts in the right direction while elongating after resting across the patterns P1 and P2 as indicated by B1. However, since the OR output terminal pattern P4 becomes wider at the place just after the operation area, the magnetic bubble changes its shape from B2 to B3, and it moves away from the AND terminal X·Y to be transferred only to the OR output terminal X+Y as indicated by B4. This portion forms a second magnetic bubble transfer section. In the circuit of FIGS. 3A and 3B, as stated above, since there is no magnetic field inclination in the operation area, the repulsive force balancing is very good, so that there occurs no such phenomenon that the magnetic bubble B2 tends to disappear as shown in FIG. 1B and, besides, a large operation margin can be obtained.

In the circuit of FIGS. 3A and 3B, patterns P3 and P4 have different widths from each other, which causes a magnetic field inclination; but a distance between magnetic bubbles B5 and B6 shown in FIG. 3B, is so large that the magnetic bubble B5 cannot be readily affected by the other magnetic bubble B6 and caused to disappear.

Figure 4:
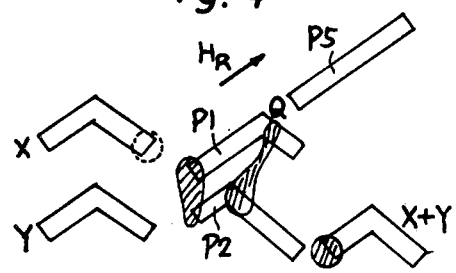
FIG. 4 shows a magnetic bubble transfer route pattern illustrating an example of an OR gate circuit according to this invention.

FIG. 4 shows an OR gate in the case when no AND output is needed. When the magnetic field $H_R$ rotating in the surface is directed to the indicated direction, the attractivity of the pattern P1 for the magnetic bubble is lost at a point Q on account of a magnetic field of reverse direction produced by a pattern P5. Accordingly, the magnetic bubble travelling astride both of the patterns P1 and P2 is transferred only to the pattern P2, and in case of the 1—1 input, the magnetic bubble which has been transferred through the pattern P1 will disappear at the point Q.

Figure 5A:
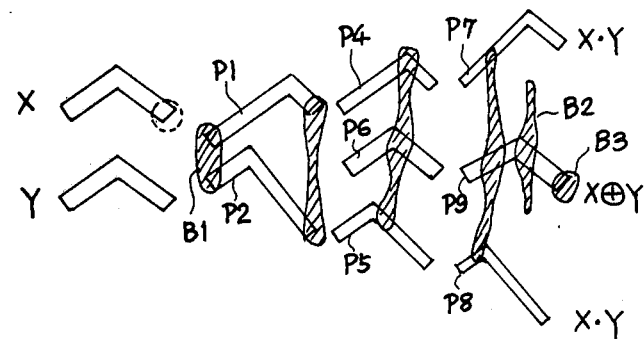
FIGS. 5A and 5B show magnetic bubble transfer route patterns illustrating an embodiment of an AND-Exclusive OR gate circuit of this invention.
Figure 5B:
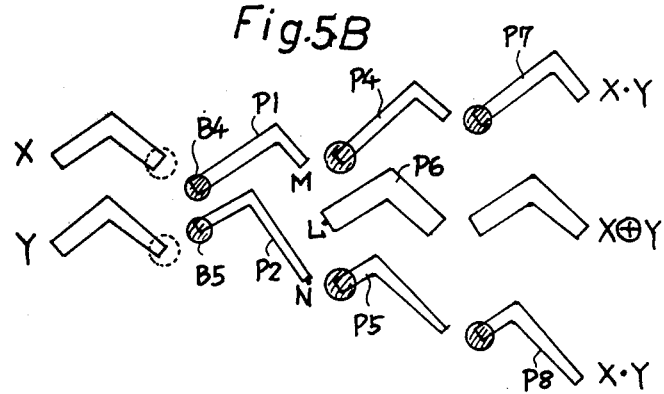

With reference to FIGS. 5A and 5B, an example of the Exclusive-OR gate circuit in accordance with the invention will now be described. In this circuit, the transfer patterns P1 and P2 have the same width in the operation area as in the case of the AND-OR gate in FIGS. 3A and 3B. This circuit is so designed that when a magnetic bubble has been applied thereto, the number of stable points of the magnetic bubble established in the operation area becomes the same as the number of input magnetic bubbles; and at the second transfer section in the operation area, the chevron patterns with different widths are arrayed in three rows as shown, thereby forming two AND output terminals and one Exclusive-OR output terminal.

Next, the operation of this circuit will be described. When either an input X or Y has a magnetic bubble, the magnetic bubble B1 catches the patterns P1 and P2 and rests across them, as if they were made one stable point in the operation area as shown in FIG. 5A. Thereafter, as the direction of application of the magnetic field rotates, the magnetic bubble is transferred while spanning across the patterns P1 and P2 and, at the next stage, across the patterns P4, P5 and P6. However, if the magnetic bubble is transferred further to the next stage, since a distance between patterns P7 and P8 becomes gradually extended with respect to a pattern P9, two ends of the magnetic bubble leaves from the patterns P7 and P8; and the magnetic bubble contracts to become round only on the pattern P9 disposed so as to merge as an elongated magnetic bubble, as indicated by B2 and B3, and is sent out only to the Exclusive-OR output terminal.

In a case where the magnetic bubbles have entered both of the X-input and the Y-input, magnetic bubbles B4 and B5 catch the patterns P1 and P2 respectively as shown in FIG. 5B and reach points M and N. In the circuit of FIGS. 5A and 5B, the distances M-L and N-L are sufficiently large to prevent the magnetic bubble from transferring to the intermediate pattern P6 from the point M or N. Accordingly, the two magnetic bubbles which have caught the patterns P1 and P2 respectively are sent out to the AND output terminals by travelling on the transfer patterns, namely, the outermost ones P4, P7 and P5, P8, respectively.

Figure 6:
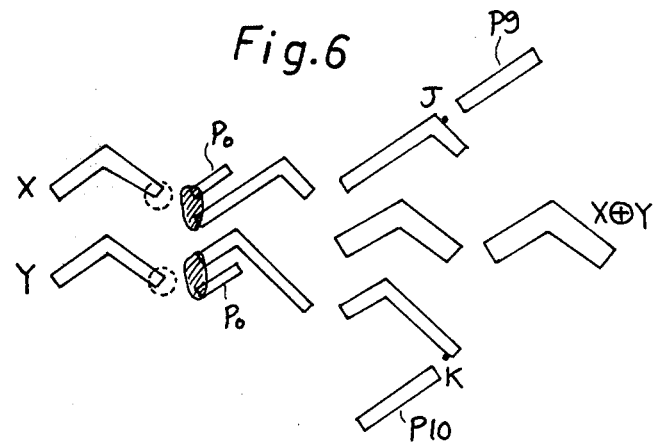
FIG. 6 is a magnetic bubble transfer route pattern illustrating an example of an Exclusive-OR circuit according to this invention.

FIG. 6 shows a circuit designed to obtain only the Exclusive-OR output, and a magnetic bubble which has transferred to any of the AND output terminals is erased at a point J or a point K by the magnetic field produced by a pattern P9 or P10, respectively. In the operation area, there are disposed auxiliary patterns P0 in side-by-side relation to the patterns P1 and P2 in order to ensure the stability of operation.

Figure 7:
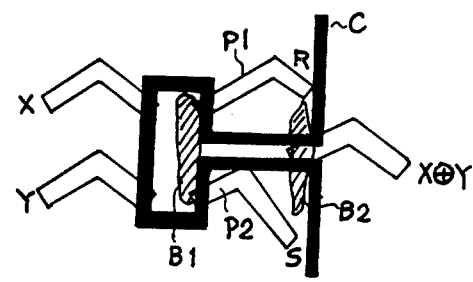
FIG. 7 is a magnetic bubble transfer route pattern diagram showing another embodiment of the Exclusive OR gate circuit of this invention.

FIG. 7 shows an example of a circuit for further improving the operation margin. In this circuit, the patterns P1 and P2 are disposed apart in the operation area, which is surrounded by a conductor C.

This circuit, upon two magnetic bubbles entering the operation area, has a weak current flow through the conductor C to make the two magnetic bubbles mutually interact. In the case of only one input magnetic bubble, the magnetic bubble elongates as indicated by B1 in accordance with the strength of a magnetic field produced by the conductor C and catches the patterns P1 and P2, and the magnetic bubble shrinking on the intermediate pattern after leaving from points R and S is sent out only to the Exclusive-OR output terminal.

In the case of two input magnetic bubbles, the both magnetic bubbles, though they elongate a little respectively, do not formed into a single merged bubble within the conductor C due to their mutual repulsive action, but they behave as described above in connection with FIGS. 5B and FIG. 6; and after transferring to the patterns P1 and P2, they disappear at the points R and S due to the magnetic field produced by the conductor C. In this circuit, because the patterns P1 and P2 can be disposed apart from each other, the operation margin in the case of X=1 input and Y=1 input can be improved.

In the above description, as means for disposing the magnetic bubble across the both patterns P1 and P2 in the case of one magnetic bubble input, a magnetic field produced by the use of a conductor is adopted; but it is not limited specifically to such a construction, and it is also possible, for example to elongate to cause the magnetic bubble, at the time when it has entered the logical operation area, as indicated by B1, by weakening the bias magnetic bubble to catch the patterns P1 and P2.

Figure 8:
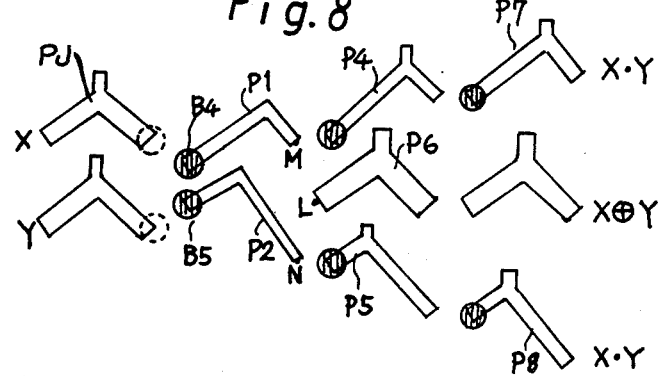
FIG. 8 is a magnetic bubble transfer route pattern illustating another example of chevron patterns employed in this invention.

The chevron patterns employed in each of the above embodiment of this invention may be modified as shown in FIG. 8, which corresponds to the embodiment shown in FIG. 5B. In FIG. 8, each chevron pattern except patterns P1 and P2 has a projection PJ, where a magentic bubble can be more stably held than with the above mentioned chevron pattern having no projection.

As described above in detail, the present invention is aimed at preventing the occurrence of mis-operations by designing to produce on the occasion of entering of the magnetic bubbles the stable points in the operation area in the same number as that of input magnetic bubbles as well as improving the operation margin, so that it has high industrial merits.

What we claim is:

1. In a logical operation circuit for performing a desired logical operation by transferring at least one magnetic bubble on a plurality of magnetic bubble transfer paths employing chevron patterns, the improvement comprising:

means comprising a first magnetic bubble transfer section provided in two neighboring ones of the magnetic bubble transfer paths for stably holding a single magnetic bubble transferred along one of the two magnetic bubble transfer paths across the two magnetic bubble transfer paths therein and for stably holding two magnetic bubbles transferred along the two magnetic bubble transfer paths each on a respective one of the two magnetic bubble transfer paths;

means comprising a second magnetic bubble transfer section connected to said first magnetic bubble transfer section and formed by a section of the two neighboring magnetic bubble transfer paths having an enlarged space between the two neighboring magnetic bubble transfer paths along the propagation direction of said magnetic bubbles for elongating the single magnetic bubble passed through the first magnetic bubble transfer section in such a state as to extend across both of the two magnetic bubble transfer paths and for resting said two magnetic bubbles each on a respective one of the wider spaced two neighboring magnetic bubble transfer paths; and output terminal means comprised of three magnetic bubble transfer paths at the succeeding stage of said second magnetic bubble transfer section for coupling all of the three magnetic bubble transfer paths with said elongated magnetic bubble and positioned defining respective spaces between respective ends of the two magnetic bubble transfer paths of said second magnetic bubble transfer section and an end of the center one of the three magnetic bubble transfer paths which are sufficiently greater than respective spaces defined between the respective ends of the two magnetic bubble transfer paths of said second magnetic bubble transfer section and respective ends of the outer two of the three magnetic bubble transfer paths for transferring said elongated magnetic bubble to a center one of the three magnetic bubble transfer paths, and for coupling said two resting magnetic bubbles each with a respective end one of said three magnetic bubble transfer paths and for transferring the two magnetic therealong without coupling to the middle magnetic bubble transfer path to derive at least one magnetic bubble at at least one predetermined path of said three magnetic bubble transfer paths as a logical output corresponding to a desired logical operation with respect to the input state of a magnetic bubble applied to the two magnetic bubble transfer paths of said first magnetic bubble transfer section.

2. A logical operation circuit according to claim 1, in which said first magnetic bubble transfer section is formed by narrowed transfer paths.

3. A logical operation circuit according to claim 1, in which said first magnetic bubble transfer section is formed by a loop conductor coupled to said two magnetic bubble transfer paths for flowing therethrough a current to enlarge the magnetic bubble in said first magnetic bubble transfer section.

4. A logical operation circuit according to claim 1, in which said first magnetic bubble transfer section comprises multiple patterns in addition to said two magnetic bubble transfer paths.

* * * * *